US009633891B2

(12) United States Patent
Collaert et al.

(10) Patent No.: US 9,633,891 B2
(45) Date of Patent: Apr. 25, 2017

(54) METHOD FOR FORMING A TRANSISTOR STRUCTURE COMPRISING A FIN-SHAPED CHANNEL STRUCTURE

(71) Applicant: IMEC VZW, Leuven (BE)

(72) Inventors: Nadine Collaert, Blanden (BE); Geert Eneman, Balen (BE); Naoto Horiguchi, Leuven (BE); Min-Soo Kim, Leuven (BE); Rita Rooyackers, Kessel-lo (BE); Anabela Veloso, Leuven (BE); Liesbeth Witters, Linden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/924,832

(22) Filed: Oct. 28, 2015

(65) Prior Publication Data
US 2016/0126131 A1    May 5, 2016

(30) Foreign Application Priority Data

Oct. 31, 2014   (EP) .................................... 14191340

(51) Int. Cl.
*H01L 21/762*   (2006.01)
*H01L 21/32*    (2006.01)
(Continued)

(52) U.S. Cl.
CPC ........ *H01L 21/76224* (2013.01); *H01L 21/32* (2013.01); *H01L 21/32055* (2013.01);
(Continued)

(58) Field of Classification Search
CPC ............... H01L 21/76224; H01L 21/32; H01L 21/32055; H01L 29/0649; H01L 29/42392; H01L 29/66742; H01L 29/78696
See application file for complete search history.

(56) References Cited

U.S. PATENT DOCUMENTS 8,445,973 B2    5/2013  Luo et al.
8,816,428 B1    8/2014  Miller et al.
(Continued)

OTHER PUBLICATIONS

Desalvo, Gregory C. et al., "Etch Rates and Selectivities of Citric Acid/Hyrdrogen Peroxide on GaAs, Al0.3Ga0.7As, In0.2Ga0.8As, In0.53Ga0.47As, In0.52Al0.48As and InP", J. Electrochem. Soc., vol. 139, No. 3, Mar. 1992, pp. 831-835.
(Continued)

*Primary Examiner* — Fernando L Toledo
*Assistant Examiner* — Neil Prasad
(74) *Attorney, Agent, or Firm* — McDonnell Boehnen Hulbert

(57) ABSTRACT

An example method includes providing a layer stack in a trench defined by adjacent STI structures and recessing the STI structures adjacent to the layer stack to thereby expose an upper portion of the layer stack, the upper portion comprising at least a channel portion. The method further includes providing one or more protection layers on the upper portion of the layer stack and then further recessing the STI structures selectively to the protection layers and the layer stack, to thereby expose a central portion of the layer stack. And the method includes removing the central portion of the layer stack, resulting in a freestanding upper part and a lower part of the layer stack being physically separated from each other.

12 Claims, 16 Drawing Sheets

(51) Int. Cl.
*H01L 21/3205* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 29/0649* (2013.01); *H01L 29/42392* (2013.01); *H01L 29/66742* (2013.01); *H01L 29/78696* (2013.01)

(56) References Cited

U.S. PATENT DOCUMENTS

| | | |
|---|---|---|
| 2002/0086472 A1 | 7/2002 | Roberds et al. |
| 2003/0190766 A1 | 10/2003 | Gonzalez et al. |
| 2005/0196924 A1 | 9/2005 | Mimura |
| 2007/0241420 A1* | 10/2007 | Choi ............... H01L 29/42392 257/506 |
| 2011/0316080 A1 | 12/2011 | Luo et al. |
| 2013/0256784 A1 | 10/2013 | Vellianitis et al. |
| 2014/0084342 A1* | 3/2014 | Cappellani ............. B82Y 10/00 257/192 |
| 2015/0179797 A1* | 6/2015 | Yin .................... H01L 29/66636 257/192 |

OTHER PUBLICATIONS

Cheng, Zhi-Yuan et al., "SiGe-On-Insulator (SGOI): Substrate Preparation and MOSFET Fabrication for Electron Mobility Evaluation", 2001 IEEE International SOI Conference, 2001, pp. 13-14.
Extended European Search Report for related European Patent Application No. 14191340.0.

* cited by examiner

| Channel | Etch stop layer | Virtual buffer | Comments |
|---|---|---|---|
| SiGe x% | SiGe y% y<x,z | SiGe z% | General case |
| Germanium | Silicon | Germanium | NFET + PFET, Si thin |
| Germanium | SiGe50% | Germanium | NFET + PFET |
| Germanium | Silicon | SiGe75% | PFET |
| SiGe75% | Silicon | SiGe50% | PFET |
| GaAs | $Al_{0.3}Ga_{0.7}As$ | GaAs | NFET + PFET |
| $In_{0.2}Ga_{0.8}As$ | $Al_{0.3}Ga_{0.7}As$ | $In_{0.2}Ga_{0.8}As$ | NFET + PFET |
| $In_{0.2}Ga_{0.8}As$ | GaAs | $In_{0.2}Ga_{0.8}As$ | NFET + PFET |
| $In_{0.53}Ga_{0.47}As$ | $In_{0.52}Al_{0.48}As$ | $In_{0.53}Ga_{0.47}As$ | NFET + PFET |
| $In_{0.53}Ga_{0.47}As$ | InP | $In_{0.53}Ga_{0.47}As$ | NFET + PFET |
| $In_{0.52}Al_{0.48}As$ | InP | $In_{0.52}Al_{0.48}As$ | NFET + PFET |

Fig. 15

| Channel | Etch stop layer | Sacrif. layer | Virtual buffer | Comments |
|---|---|---|---|---|
| SiGe x% | SiGe y% y<x,z | SiGe w% w>x,z | SiGe z% | *General case* |
| Germanium | Silicon | Ge | SiGe75% | *PFET* |
| SiGe75% | Silicon | Ge | SiGe50% | *PFET* |

Fig. 16

METHOD FOR FORMING A TRANSISTOR STRUCTURE COMPRISING A FIN-SHAPED CHANNEL STRUCTURE

CROSS-REFERENCE TO RELATED APPLICATIONS

This application claims priority to European Patent Application Serial No. 14191340.0 filed Oct. 31, 2014, the entire contents of which is hereby incorporated by reference in its entirety.

FIELD

The present disclosure relates to a method for forming a transistor structure comprising a fin-shaped channel structure, and to an associated semiconductor structure.

BACKGROUND

Following the ITRS roadmap, transistor structures are becoming smaller and smaller. Today, nanoscale structures having suitable and stable properties, as for instance nanowire (NW) transistor channel structures (e.g. in gate-all-around (GAA) transistor structures), are desired. Producing such nanoscale structures is not evident.

It has been shown that forming a gate-all-around (GAA) or nanowire (NW) transistor structure by means of local oxidation of the lower surface of a fin structure leads to an irregular, unwanted shape of the channel. This results in lack of stability and controllability of the properties of the produced transistor structures.

In US 2011/0316080 a method is described for fabricating a fin transistor structure, comprising forming a fin on a substrate, wherein an insulation material is formed between a portion of the fin serving as the channel region of the transistor structure and the substrate.

There exists a need for improved and alternative methods for forming transistor structures comprising a nanowire channel structure.

SUMMARY

It is an aim of the present disclosure to provide a method for forming a transistor structure comprising a fin-shaped channel structure.

This aim is achieved according to the disclosure with the method showing the technical characteristics of the first independent claim.

It is a further aim of the present disclosure to provide an associated semiconductor structure.

This aim is achieved according to the disclosure with the method showing the technical characteristics of the second independent claim.

According to a first aspect of the present disclosure, a method is disclosed for forming a transistor structure comprising a fin-shaped channel structure, comprising:
  providing a layer stack (e.g., a layer stack provided by epitaxial growth), embedded laterally in shallow trench isolation (STI) structures, e.g. the STI structures and the layer stack abutting on a front surface;
  recessing the STI structures adjacent to the layer stack to thereby expose an upper portion of the layer stack, the upper portion comprising at least a channel portion (e.g. such that the layer stack is protruding from the STI structures on the front surface);
  providing one or more protection layers on the upper portion of the layer stack;
  after providing one or more protection layers, further recessing the STI structures selectively to the protection layers and the layer stack, to thereby expose a central portion of the layer stack (a lower portion of the layer stack may remain laterally embedded by the recessed STI structures);
  removing the central portion of the layer stack, resulting in a freestanding (e.g. released) upper part and a lower part of the layer stack being physically separated from each other;
  wherein providing the layer stack comprises providing an etch stop layer, in the layer stack, at a position directly below the channel portion (and e.g. directly above the central portion), such that the freestanding upper part of the layer stack comprises an etch stop layer at its lower surface after selectively removing the central portion.

It is an advantage that the shape of the thus formed channel structure can be better controlled than in the prior art, resulting in a better reproducibility and stability of the eventual transistor devices.

According to example embodiments, providing a layer stack comprises epitaxially growing the layer stack in the trenches defined in between adjacent shallow trench isolation (STI) structures. These trenches can be provided by recessing silicon protrusions which are laterally embedded by the STI structures.

The STI structures can be provided on a substrate by recessing a bulk or other substrate in predetermined STI regions and depositing the STI material in said recessed STI regions.

Epitaxially growing the layer stack can comprise growing a virtual buffer layer (also known to the skilled person as a Strain Relaxed Buffer layer (SRB layer)), and growing an etch stop layer epitaxially thereon, followed by growing a channel layer or material or structure on top of the etch stop layer. The layer stack and the adjacent STI structures can for instance abut on a common substantially planar surface, after growth or after an optional planarizing step on the front surface.

Growing the layer stack in narrow trenches, for instance defined by adjacent STI structures, results in a relatively low amount of defects in the grown layers. Such a growth technique is known in the art as Aspect Ratio Trapping (ART). The use of the ART in the context of the present disclosure allows growing thinner layers (e.g. thinner than 500 nm, for instance having a thickness in between 50 nm and 300 nm) of high quality (low defects), when compared to the growth of epitaxial layers on large surface (as e.g. on a blanket substrate).

It is a further advantage of embodiments of the present disclosure, that epitaxially growing the layer stack in the trenches defined laterally by adjacent STI structures, results in well defined, relatively flat sidewalls of the layer stack. Indeed, the sidewalls may exactly follow the previously defined (flat) sidewalls of the adjacent STI structures. In this manner, it can be assured that the etch stop layer or layers in the layer stack then also extend(s) over the full width of the layer stack, such that it/they indeed protect the layers they are supposed to protect in embodiments of the present disclosure. If the layer stack would be grown on a large surface as e.g. on a blanket wafer, and afterwards the layer stack would be patterned into layer stack structures similar as the layer stacks grown in between the STI structures according to embodiments of the present disclosure, the sidewalls of the resulting layer stack structures could be irregular due to the lateral etching during patterning. Indeed, certain layers of the layer stack may have concave or convex side surfaces. This may also introduce unwanted "exotic" topographies of the side surfaces of the stack, for instance also at the lateral interface between two adjacent layers. This may result in the presence of leakage openings at the height of the etch stop layer(s), especially near the edges of the etch stop layer(s), jeopardizing its main functionality.

According to example embodiments, the channel portion and the STI structures abut a common planar surface, and the method further comprises providing a patterned hard mask layer on top of the layer stack, before recessing the STI structures. The patterned hard mask layer can be used as a mask layer for the recessing of the STI structures, but the patterned hard mask layer can thereafter also embody/serve as a protection layer for further recessing the STI structures.

According to example embodiments, providing the layer stack comprises providing a second etch stop layer on top of the channel portion, before recessing the STI structures, the second etch stop layer embodying a protection layer for further recessing the STI structures. The second etch stop layer can be used as a mask layer for the recessing of the STI structures, but the second etch stop layer can thereafter also embody/serve as a protection layer for further recessing the STI structures.

According to example embodiments, the method further comprises growing spacer structures directly adjacent to the exposed upper portion of the layer stack, after recessing the STI structures adjacent to the layer stack to thereby expose an upper portion of the layer stack, the spacer structures embodying protection layers for further recessing the STI structures. The spacer structures are, for example, grown along the sidewalls of the exposed upper portion of the layer stack. In some examples, they cover these sidewalls completely.

According to example embodiments, the method further comprises, directly after recessing the STI structures adjacent to the layer stack to thereby expose an upper portion of the layer stack, epitaxially growing a wrap-around etch stop layer around the exposed upper portion of the layer stack, the wrap-around etch stop layer embodying a protection layer for further recessing the STI structures. The wrap-around etch stop layer may cover the sidewalls and the upper surface of the channel structure. Together with the etch stop layer, and optionally the second etch stop layer, a full envelope of the channel nanowire layer or portion is formed. In case a second etch stop layer is present, the thickness of the combined upper layer constituted by the second etch stop layer and wrap-around etch stop layer is larger. According to example embodiments, the thickness of the envelope is constant.

According to example embodiments, providing the layer stack comprises providing a third etch stop layer in the layer stack, the third etch stop layer being positioned lower in the stack than the first etch stop layer and being separated thereof by a virtual buffer layer (known to the skilled person as an SRB layer), and the third etch stop layer is arranged and adapted for allowing selectively removing the virtual buffer layer in the central portion of the layer stack, such that after the selective removal the upper layer of the lower part of the layer stack is defined by the third etch stop layer.

As is known to the skilled person, a role of a virtual buffer (layer) is to provide a lattice with a predetermined lattice constant, on which subsequent (e.g. channel) layers can be grown with little or no defects. A main purpose of the virtual buffer (layer) is to achieve the right lattice constant and the right strain (including e.g. a strain 0) in the subsequent layers.

According to example embodiments, providing the layer stack comprises providing a virtual buffer layer in the central portion of the layer stack, and selectively removing the central portion of the layer stack comprises removing the virtual buffer layer.

According to example embodiments, the etch stop layer, and, if present, the wrap-around etch stop layer, the second etch stop layer and/or third etch stop layer, comprise or consist of the same material. This facilitates defining suitable selective etch processes, e.g. the etch process used for removing the central portion.

According to example embodiments, providing the layer stack comprises providing a virtual buffer layer and a sacrificial layer directly on top of the virtual buffer layer, the sacrificial layer embodying the central portion of the layer stack, and selectively removing the central portion of the layer stack comprises removing the sacrificial layer selectively to the virtual buffer layer.

According to example embodiments, the method further comprises removing the etch stop layer after removing the central portion of the layer stack.

According to example embodiments, the method further comprises removing the one or more protection layers, or all of the protection layers, and providing a gate dielectric layer and gate layer stack on the channel layer.

According to example embodiments, the method further comprises providing a gate dielectric layer and gate layer stack on the freestanding upper part of the stack without removing at least one of the protection layers.

According to example embodiments, the method further comprises providing a gate dielectric layer and gate layer stack on the freestanding upper part of the stack, whereby the wrap-around etch stop layer is not removed.

Example material systems used are described in the detailed description set out below.

In a second aspect of the present disclosure, a semiconductor structure is disclosed, comprising a pending or suspended or freestanding bilayer structure comprising a channel structure, the channel structure suitable for use as a channel in a transistor device of the nanowire type, and a substantially flat etch stop layer defining a lower surface of the freestanding or suspended bilayer structure.

In some examples, the nanowire channel may have a height between 3 and 50 nm. For instance, the nanowire channel may have a height of 5 to 15 nm.

In some examples, the width of the channel may be between 3 and 50 nm. For instance, the width of the channel may be between 5 to 15 nm.

In some examples, the total level of active dopants in the channel may be between $1e13$ $cm^{-3}$ and $1e20$ $cm^{-3}$. For instance, the total level of active dopants in the channel may be between $1e15$ $cm^{-3}$ and $1e18$ $cm^{-3}$.

Features and advantages disclosed for one of the above aspects of the present invention are hereby also implicitly disclosed the other aspects, mutatis mutandis, as the skilled person will recognize.

Certain objects and advantages of various inventive aspects have been described herein above. It is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE FIGURES

The disclosure will be further elucidated by means of the following description and the appended figures.

FIGS. 15 and 16 systematically disclose proposed material systems which are suitable for use in embodiments of the present disclosure.

DETAILED DESCRIPTION

Figure 1:
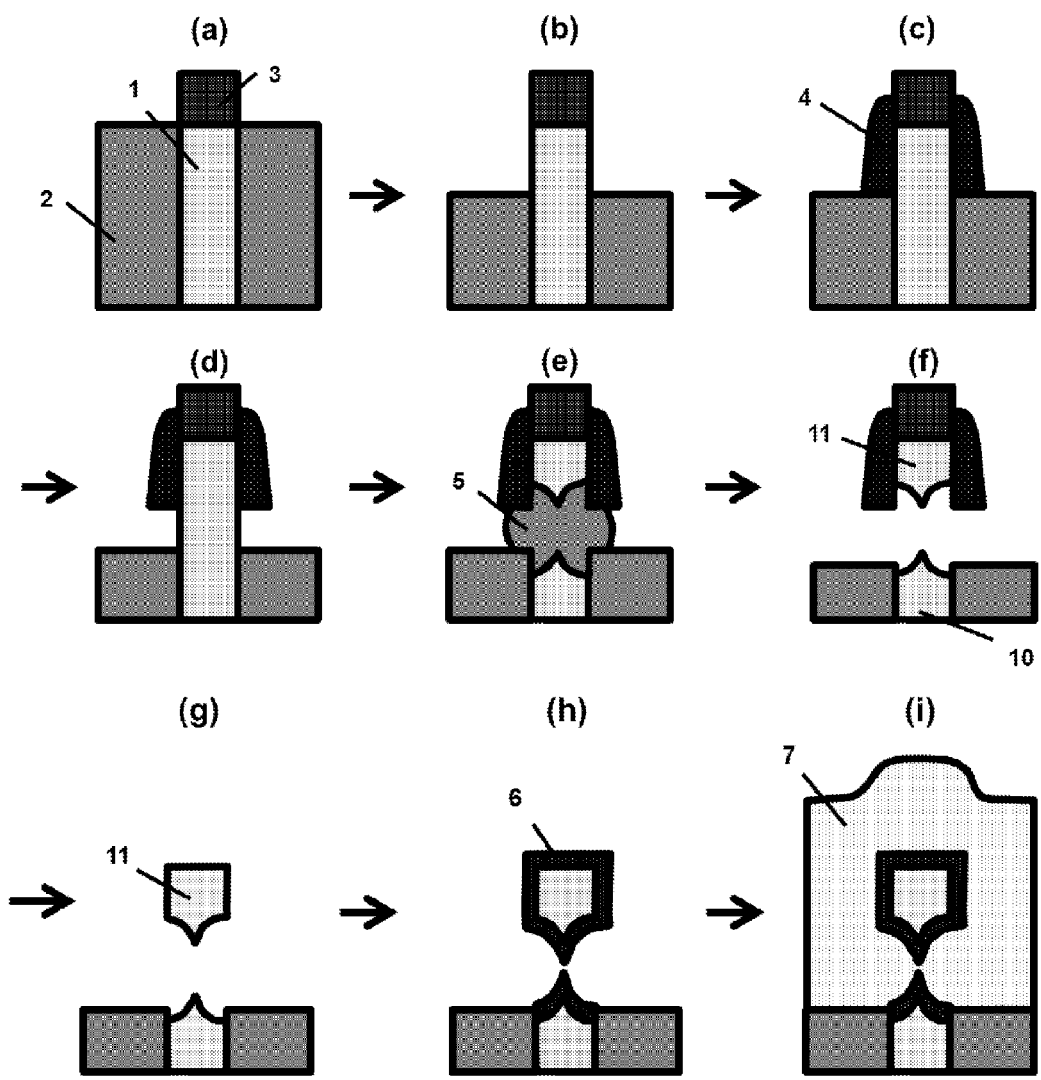
FIG. 1 illustrates a method for forming a transistor structure comprising a fin-shaped channel structure according to the prior art.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Furthermore, the various embodiments are to be construed as example manners in which the disclosure may be implemented rather than as limiting the scope of the disclosure.

FIG. 1 illustrates a method for forming a transistor structure comprising a fin shaped channel structure according to the prior art. A layer or layer stack 1 of semiconductor material is embedded laterally in shallow trench isolation structures 2. The upper surfaces of the shallow trench isolation structures and the semiconductor layer or layer stack 1 are for instance abutting a common planar surface. A hard mark layer 3 is provided on this substantially planar surface and is patterned in order to protect the semiconductor layer or layer stack 1 from a subsequent recess step of the shallow trench isolation structures 2, which are typically made from silicon dioxide ($SiO_2$) (FIGS. 1(a) and (b)). The semiconductor layer or layer stack 1 is now protruding from the surface defined by the STI structures 2. The side surface of the semiconductor layer or layer stack 1 is now exposed. The spacer material 4 is now deposited on the side walls in order to protect the protruding/exposed portion of the semiconductor layer stack 1 (FIG. 1(c)). A further recess step of the remaining STI structures is performed in order to open up a central portion CP of the semiconductor layer (stack) (FIG. 1(d)). The exposed portion of the semiconductor layer 1 is subjected to oxidation (FIG. 1(e)), so as to form SiO2, which is thereafter selectively removed by a selective etch step (FIG. 1(f)). The lower surface of the upper part 11 of the layer stack has an irregular shape, which is difficult to reproduce and which makes it difficult if not impossible to predict the properties of the freestanding upper part 11, corresponding to a channel portion of a transistor device. Also the lower part of the layer stack 1, which is now physically separated from the upper part 11, demonstrates an irregularly shaped upper surface, which is unwanted. In FIG. 1(g), the typical step of removing the protection layers from the upper part 11 of the layer stack 1 is illustrated. Typically a dielectric layer 6 is then deposited all around the upper portion 11, which constitutes the channel portion of a transistor device (FIG. 1(h)). Finally a gate stack 7 is provided on top of the dielectric layer 6 (FIG. 1(i)).

This prior art solution, based on oxidation of the central portion CP of the layer stack 1 leads to irregular nanowire shapes, which is unwanted as it reduces reproducibility and control of the device characteristics.

FIGS. 2 to 11 illustrate example embodiments of the present disclosure, which solve the above problem.

According to example embodiments, an advantage is taken of the fact that germanium/silicon germanium/silicon has an etch rate which is dependent on the germanium concentration. In such embodiments, it is recognized that it is relatively difficult to etch a low germanium concentration silicon germanium layer (for instance, having a germanium concentration smaller than 50%) selective to a high (for instance, having a germanium concentration larger than 50%) germanium concentration silicon germanium layer, which results in defining that a low germanium concentration layer can be used as an etch stop layer.

Figure 2:
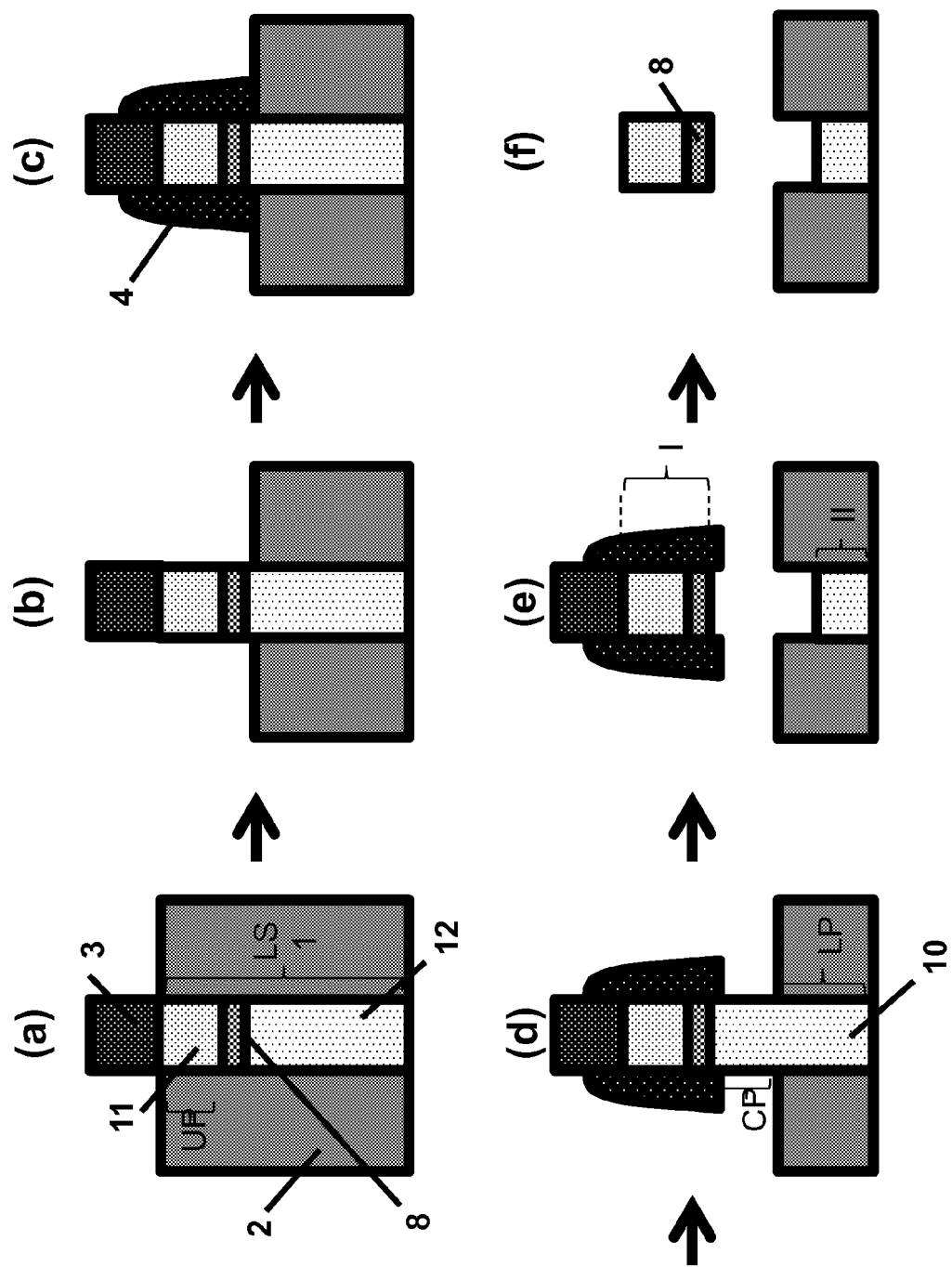
FIGS. 2 to 11 illustrate example embodiments of the present disclosure.

FIG. 2 illustrates an example embodiment according to the present disclosure. As in the prior art, an epitaxially grown layer stack (11, 8, 12) of semiconductor materials is provided, which is embedded laterally in shallow trench isolation structures 2. This is achieved, for example, by recessing a silicon protrusion defined in between two adjacent STI structures, and epitaxially growing the layer stack in the recessed trench. The layer stack 1 (or LS) comprises a virtual buffer 12 on which an etch stop layer 8 is epitaxially grown, followed by the growth of a channel layer 11 on top of the etch stop layer 8. The layer stack 1 and the adjacent STI structures 2 for instance abut on a common substantially planar surface. On the common substantially planar surface a hard mask layer 3 is provided and patterned in order to protect the layer stack 1 from a subsequent recess step of the adjacent STI structures 2 (FIG. 1(a), (b)). The recessing of the STI structures 2 adjacent to the layer stack 1 is, for example, performed up to a level which is equal or lower than the level of the etch stop layer 8 in the layer stack. Now spacer structures 4 are provided in order to protect the protruding layer stack 1. For instance, the spacer structures 4 can be formed by deposition of a combination of silicon-oxide and silicon-nitride layers, followed by directional etching, which leaves the spacer material next to the layer stack consisting of layers 12, 8 11 and 3. The hard mask layer 3 is hereby protecting the upper surface of the upper portion (UP) of the layer stack 1, while the spacer structures 4 are protecting the side walls of the upper portion of the layer stack 1 (FIG. 2(c)). A further recess step to further recess the adjacent STI structures selectively to the protection layers (comprising the hard mask layer on top and the lateral spacers 4) is now performed in order to expose a central portion (CP) of the layer stack (FIG. 2(d)). The lower portion of the layer stack remains hereby laterally embedded by the recessed STI structures. Now, the exposed central portion (CP) of the layer stack is removed, for example, by means of an etching process, resulting in a free standing upper part (I), comprising the channel layer 11 of the layer stack, and a lower part (II) of the layer stack. The lower part (II) may be a portion of the lower portion of the layer stack 1 (LS), as the removal step of the central portion may also consume an upper part of the lower portion LP of the layer stack (FIG. 2(e)). Next, the photo-resist layer 3 and spacer structures 4 are removed selectively, resulting in a freestanding or suspended channel layer 11, comprising the etch stop layer 8 at its lower surface. The etch stop layer 8 may then be removed or not removed before further processing of the device, for instance before depositing dielectric layers and gate stack for the transistor device of the FINFET-type.

Figure 3:
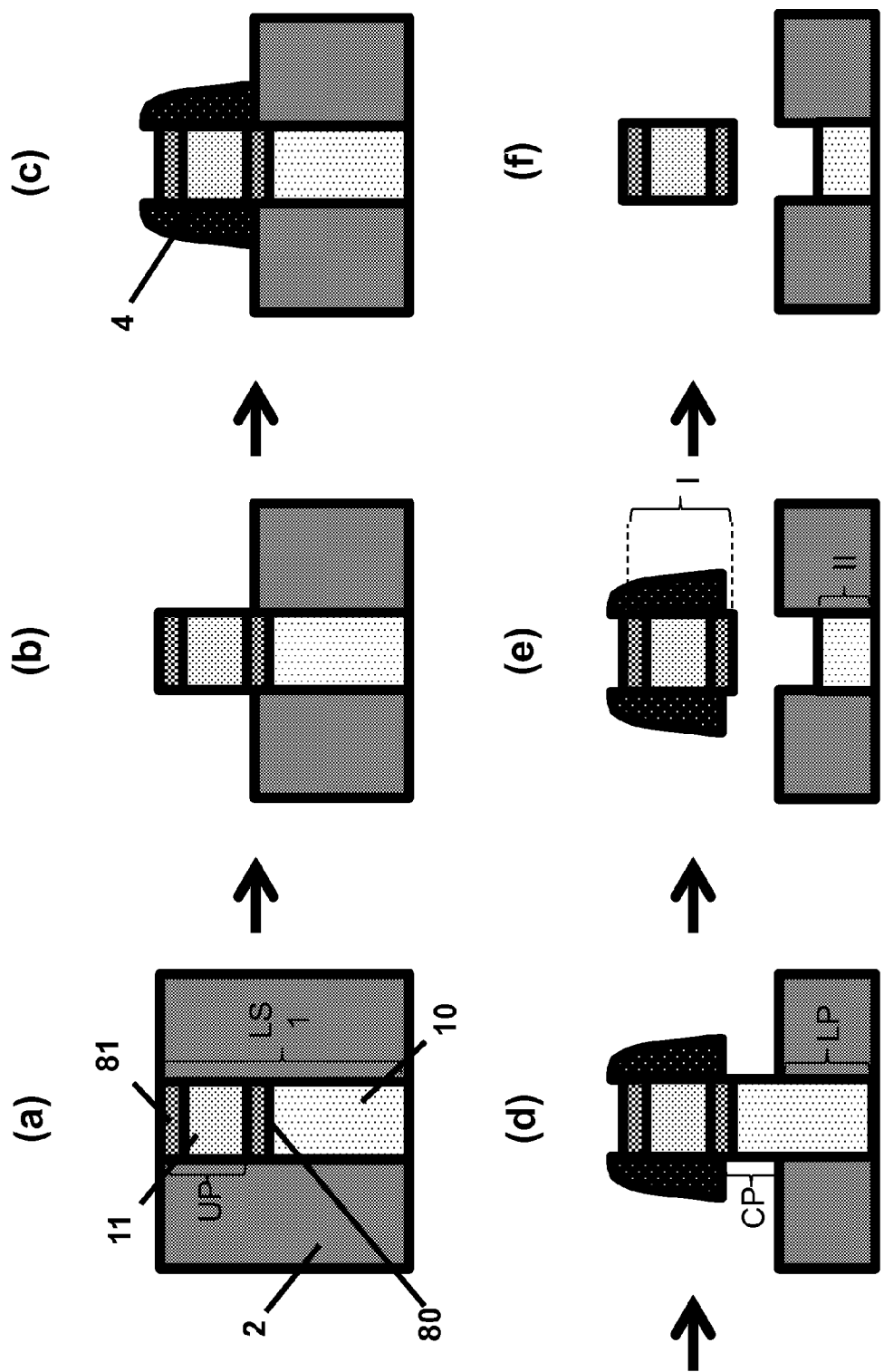

FIG. 3 illustrates a similar embodiment as the embodiment illustrated in FIG. 2, but differs there from in that the photo-resist (PR) layer 3 is replaced by a second etch stop layer 81 which is provided at the upper surface of the layer stack 1 (LS), the second etch stop layer 81 being considered part of the layer stack LS. The layer stack, comprising an upper portion (11, 81), which comprises the second etch stop layer 81, and the adjacent STI structures 2 abut on a common planar surface. The second etch stop layer 81 may serve as a masking layer for the subsequent recess step of the STI structures adjacent to the layer stack LS (FIG. 3(a),(b)). The recess step of the STI structures 2 adjacent to the layer stack 1 is, for example, performed up to a level which is equal or lower than the level of the etch stop layer 80. The spacers 4 are deposited on the side walls of the upper portion of the layer stack. The spacer 4 and the second etch stop layer 81 hereby form protection layers for the upper portion of the layer stack (FIG. 3(c)). A further recess of the STI structures is now applied selectively to the protection layers and the layer stack, to hereby expose a central portion CP of the layer stack LS. The lower portion of the layer stack remains hereby laterally embedded by the recessed STI structures. The central portion can then be removed in a similar way as explained in relation with FIG. 2, resulting in a free standing upper part of said layer stack (I), and a lower part (II) of the layer stack. The removal step of the central portion may also remove some material from the lower portion LP of the layer stack (FIG. 3(e)). After removal of the spacer structures 4, the channel layer 11, possibly with the etch stop layer 80 and second etch stop layer 81 attached to it can be further processed towards a transistor structure.

Figure 4:
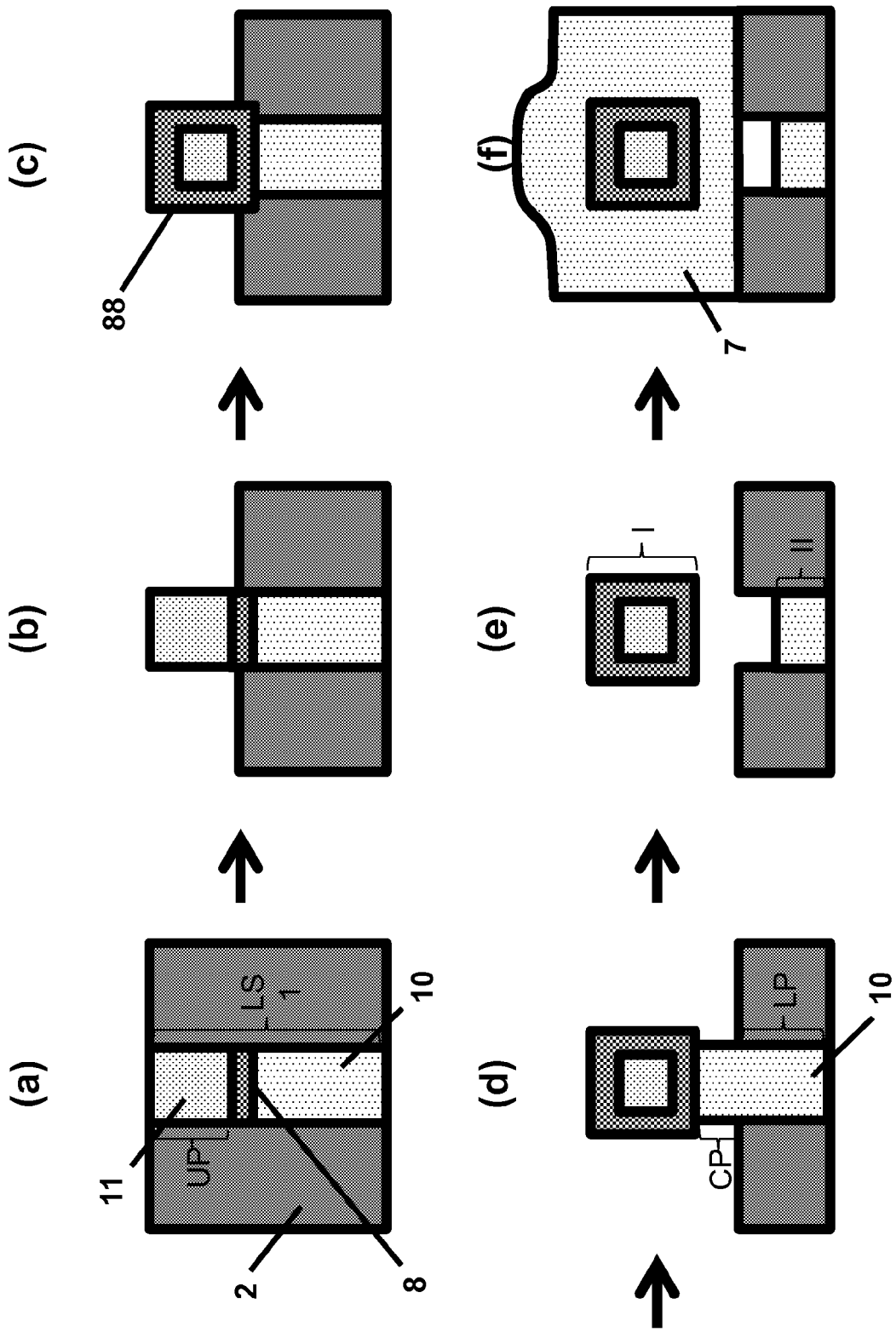

FIG. 4 illustrates a third embodiment of the present invention, which is similar to the embodiments described in relation with FIG. 2, but which differs there from in that the pattern for the photo-resist layer 3 is removed after the recessing of the STI structures adjacent to the layer stack. Then, a wrap-around etch stop layer 88 is epitaxially grown around the exposed upper portion of the layer stack, protecting the channel layer 11 from the subsequent further recessing step (FIG. 4(c)), which exposes a central portion CP of the layer stack LS. The central portion CP is removed, resulting in a free standing upper part UP of the layer stack, similar to the embodiments described in relation with FIG. 2 and FIG. 3. The wrap-around etch stop layer 88 may be removed but can be kept in the final transistor structure as a dielectric layer (FIG. 4(f)). A gate stack (layer) 7 can be applied directly on the wrap-around etch stop layer 88 and etch stop layer 8. Depending on the dimensions and the deposition of the gate stack layer 7, layer 7 may completely or not completely fill up the gap created between the free standing upper part (I) of the layer stack, and the lower part (II) of the layer stack.

Figure 5:
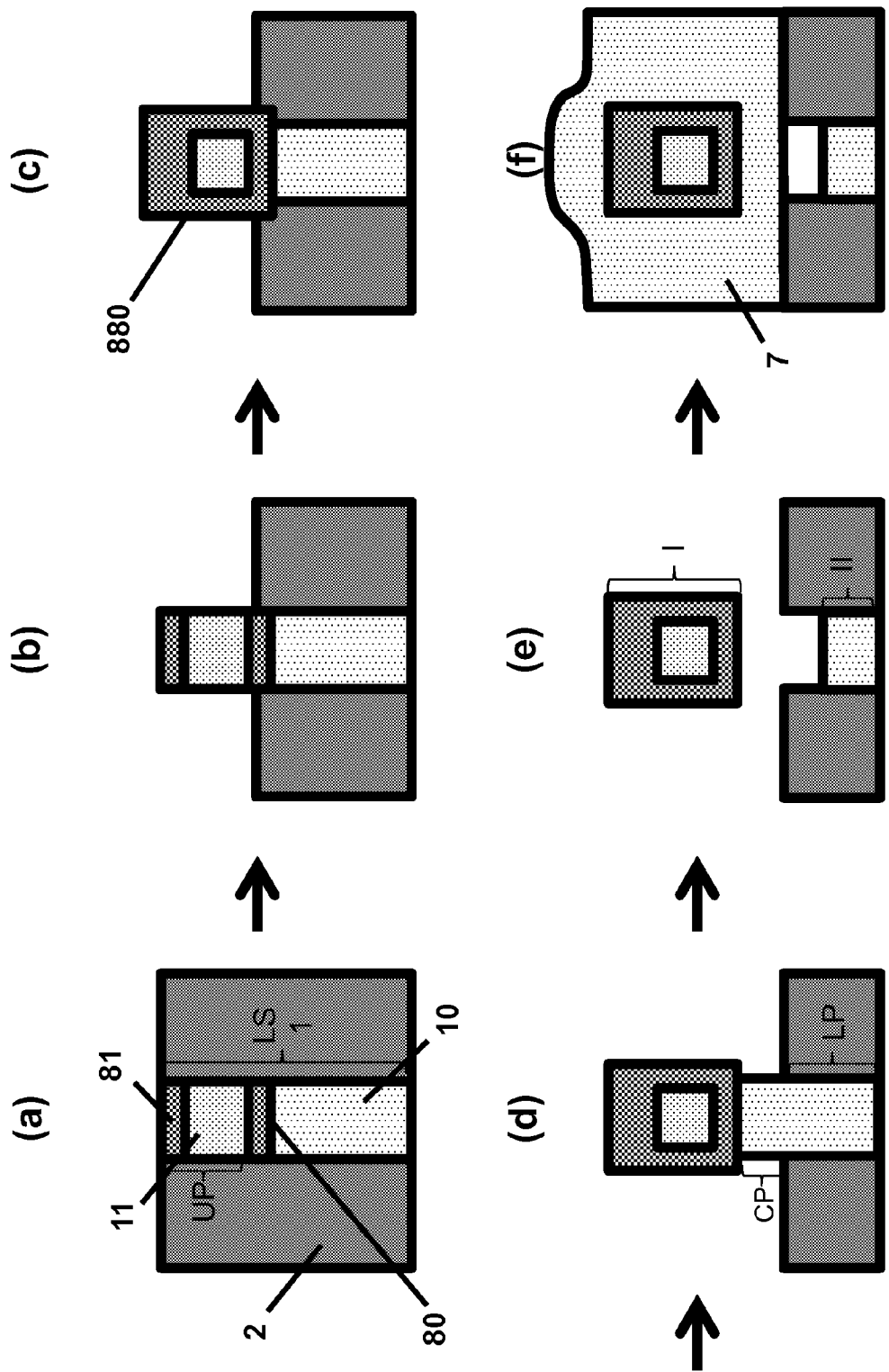

FIG. 5 illustrates a fourth example embodiment of the present disclosure, which is similar to the embodiments described in relation with FIG. 4, but wherein a second etch stop layer 81 is provided at the upper surface of the layer stack 1, which is used to protect the layer stack 1 during a recessing step of the adjacent STI structures 2, as opposed to the use of a hard mask layer 3 which was described in relation to FIG. 4 (FIGS. 5(a) and (b)). The second etch stop layer 81 may remain on the channel layer 11 when applying the all-around etch stop layer 88, in order to form an envelope 880 of the channel layer 11 (FIG. 5(c)). A further recess step is applied (FIG. 5(d)), after which the central portion CP of the layer stack LS is removed and the transistor structure is further formed (FIG. 5(e), (f)). A gate stack 7 can be applied directly on the envelope 880. Depending on the dimensions and the deposition of the gate stack 7, layer 7 may completely or not completely fill up the gap created between the free standing upper part (I) of the layer stack, and the lower part (II) of the layer stack.

Figure 6:
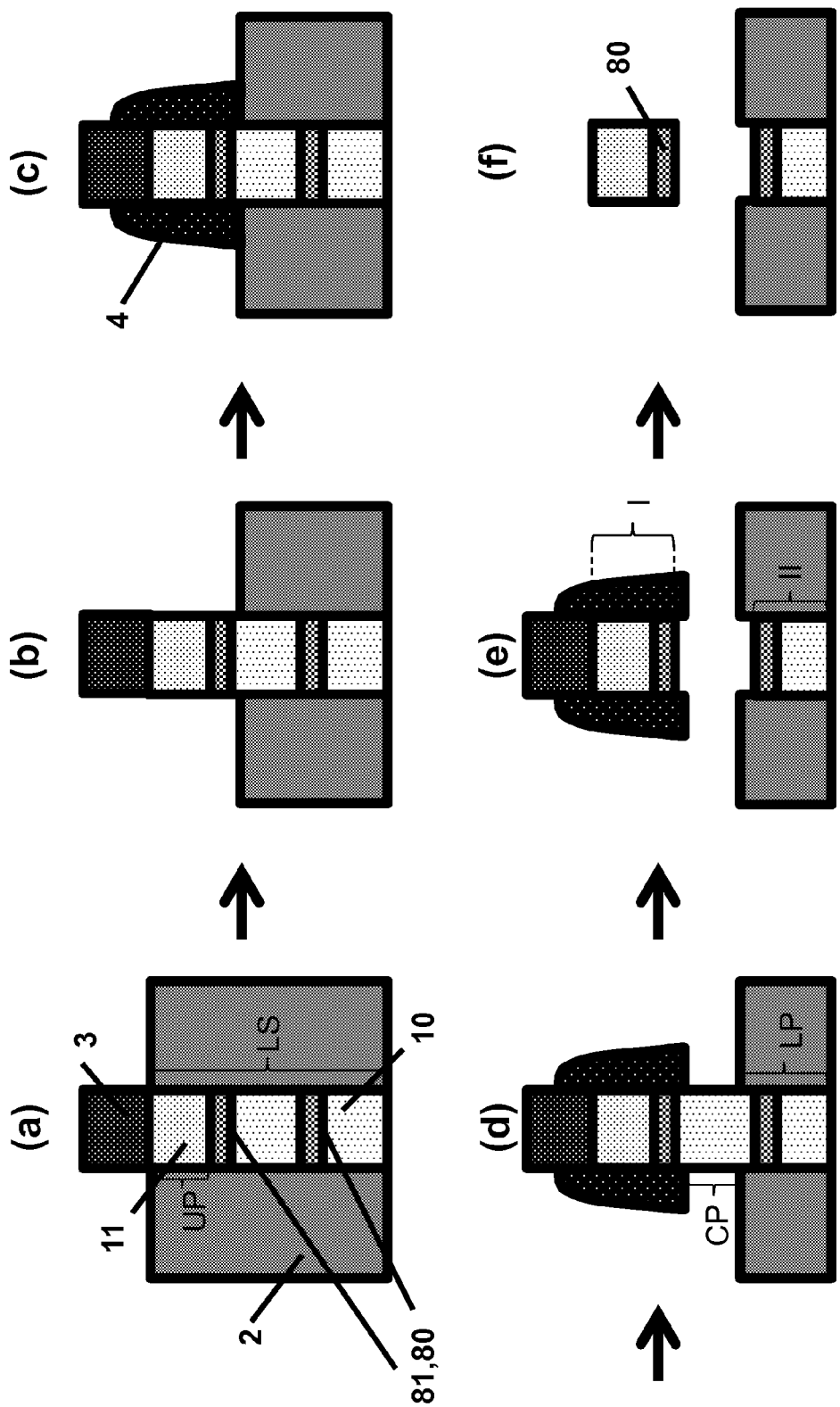

FIG. 6 illustrates a fifth example embodiment of the present disclosure, which is similar to the embodiments described in relation with FIG. 2, but differs there from in that the layer stack LS further comprises a third etch stop layer 80 which is positioned lower than the etch stop layer 81 and separated there from by a virtual buffer layer. The third etch stop layer will eventually define the upper surface of the lower part (II) of the layer stack (FIG. 6(a)). As illustrated in FIG. 6(b), the recessing of the adjacent STI structures 2 is performed up to a level which is equal or lower than the level of the etch stop layer 81, but which is higher than the level of the third etch stop layer 80. Spacer structures 4 are applied as described before (FIG. 6(c)), after which a further recessing step is applied recessing the adjacent STI structures 2 up until a level which is equal of higher than the level of the third etch stop layer 80 (FIG. 6(d)). The central portion of the layer stack is then removed, whereby also the lower part (II) of the layer stack remains unaffected due to the selectivity of the etching process of the virtual buffer layer 11 with respect to the etch stop layers 80 and 81 (FIG. 6(e)). Also here, finally, at least the spacer and photo-resist layers are removed before further processing of the transistor device (FIG. 6(f)).

Figure 7:
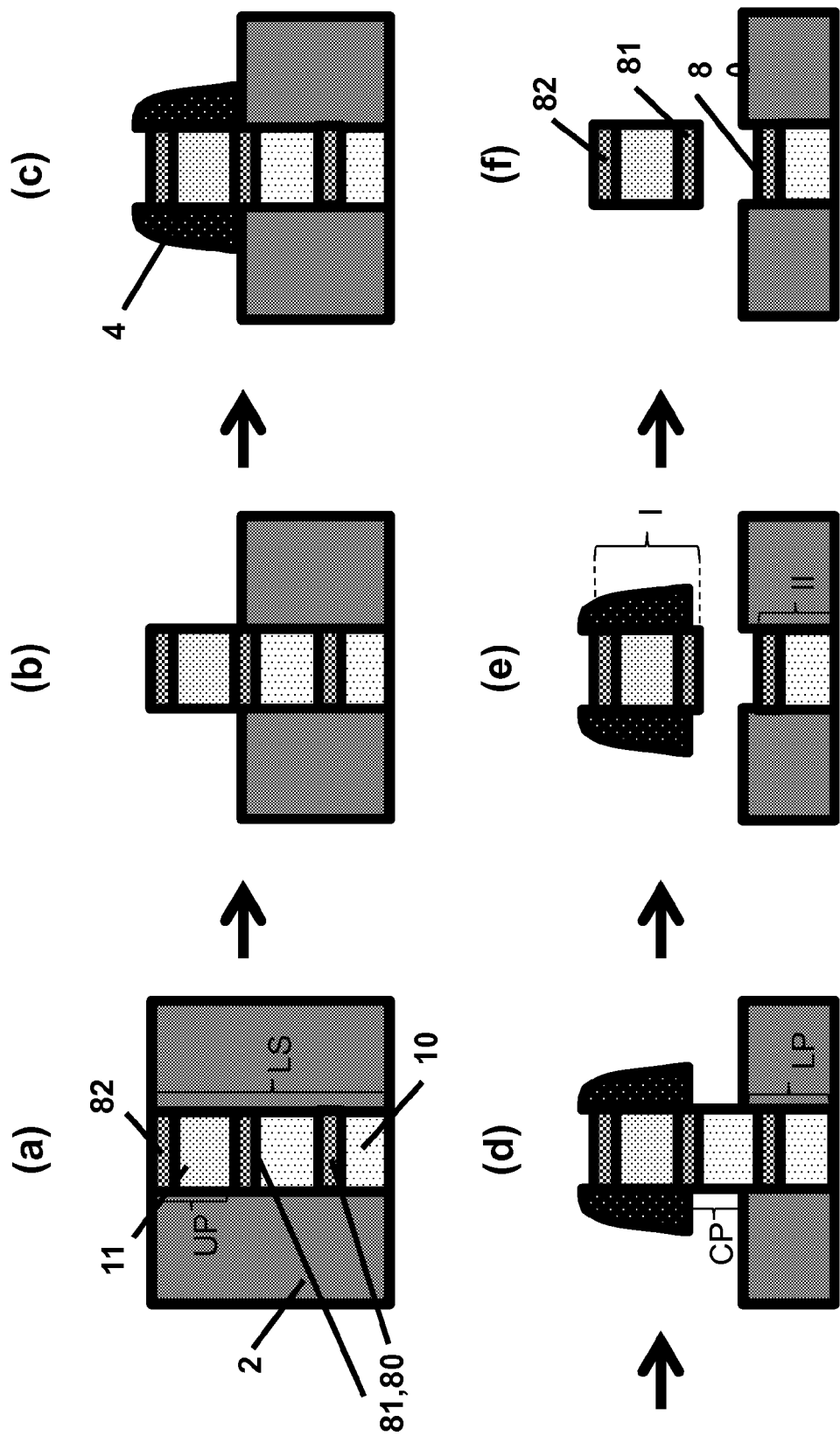
Figure 8:
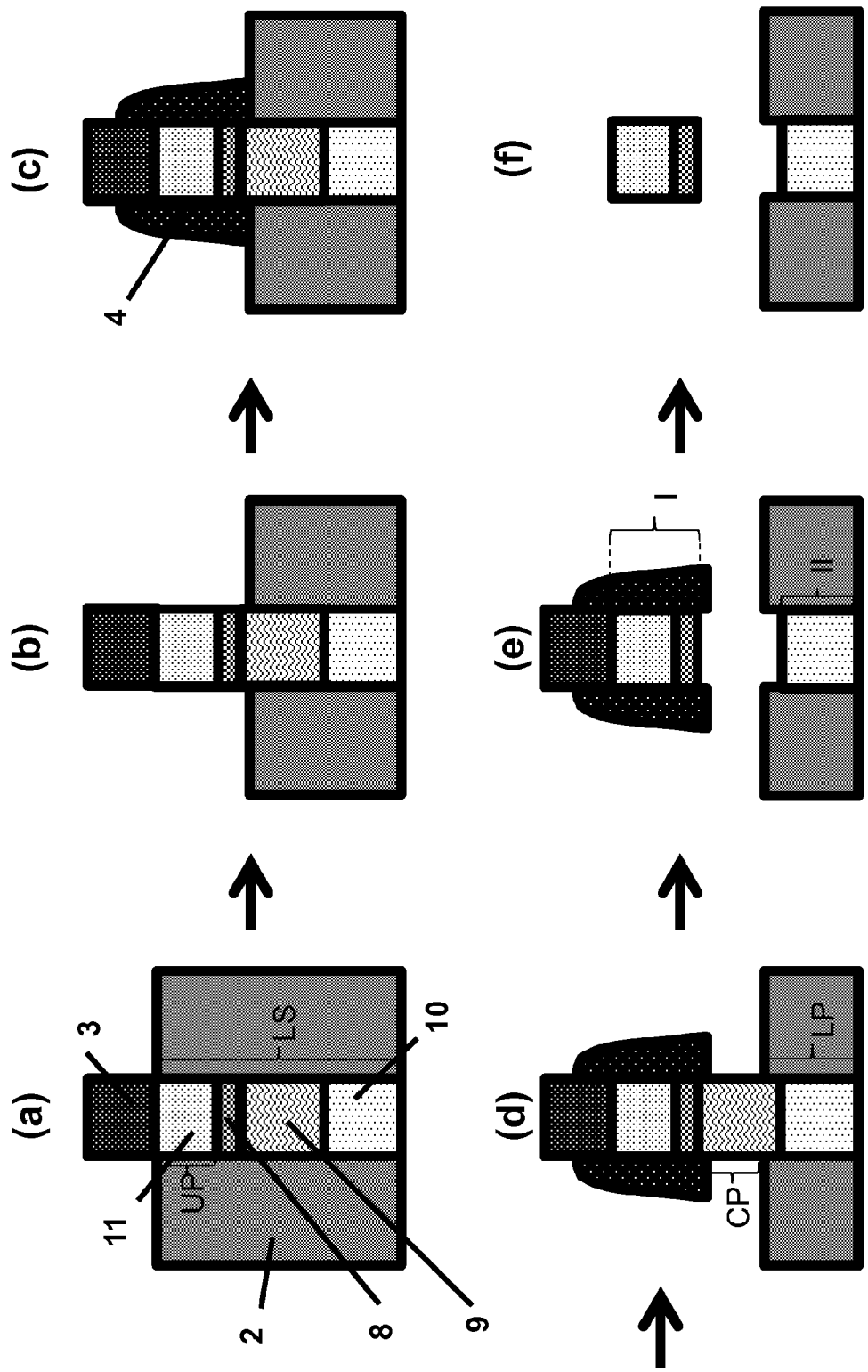
Figure 9:
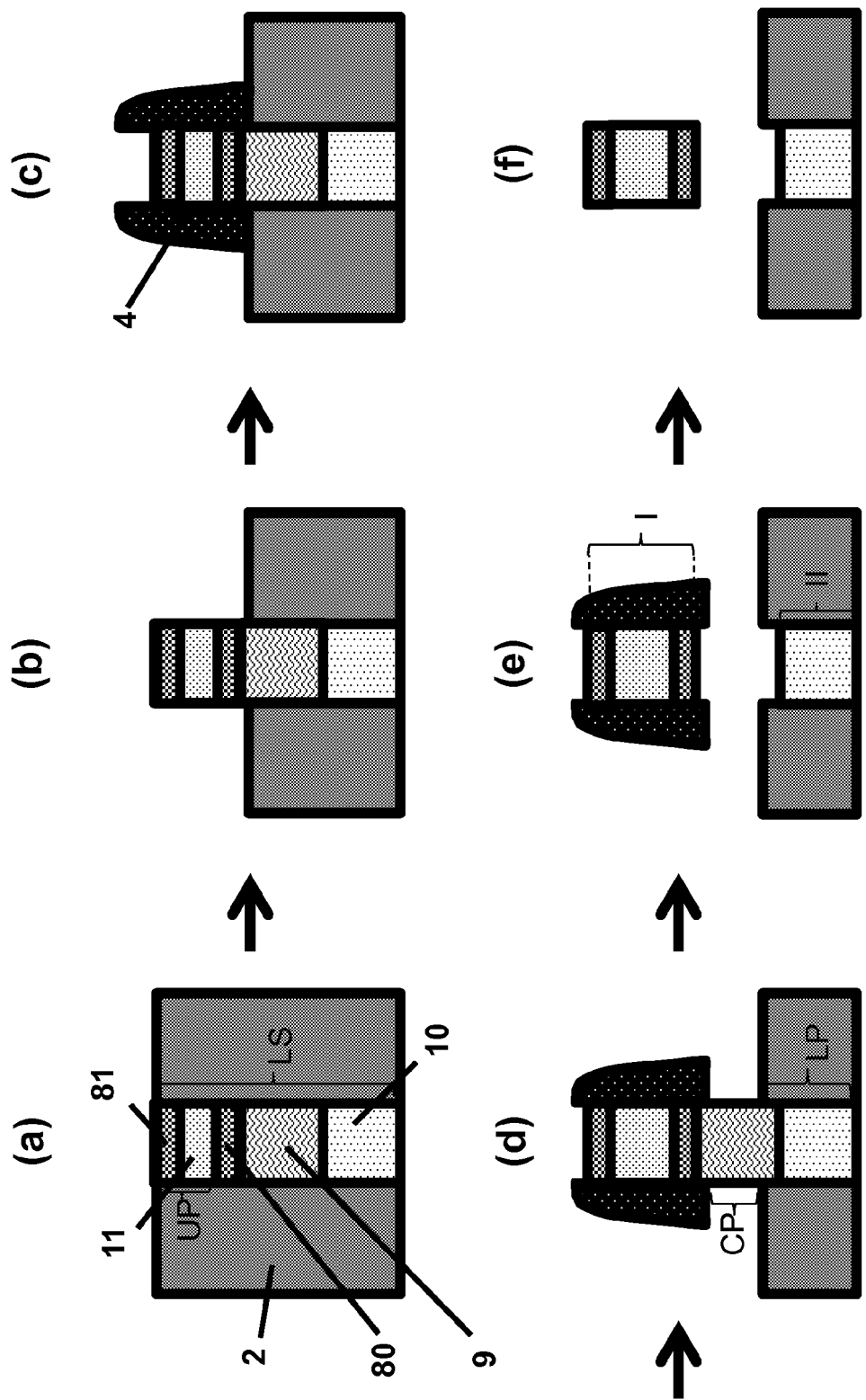
Figure 10:
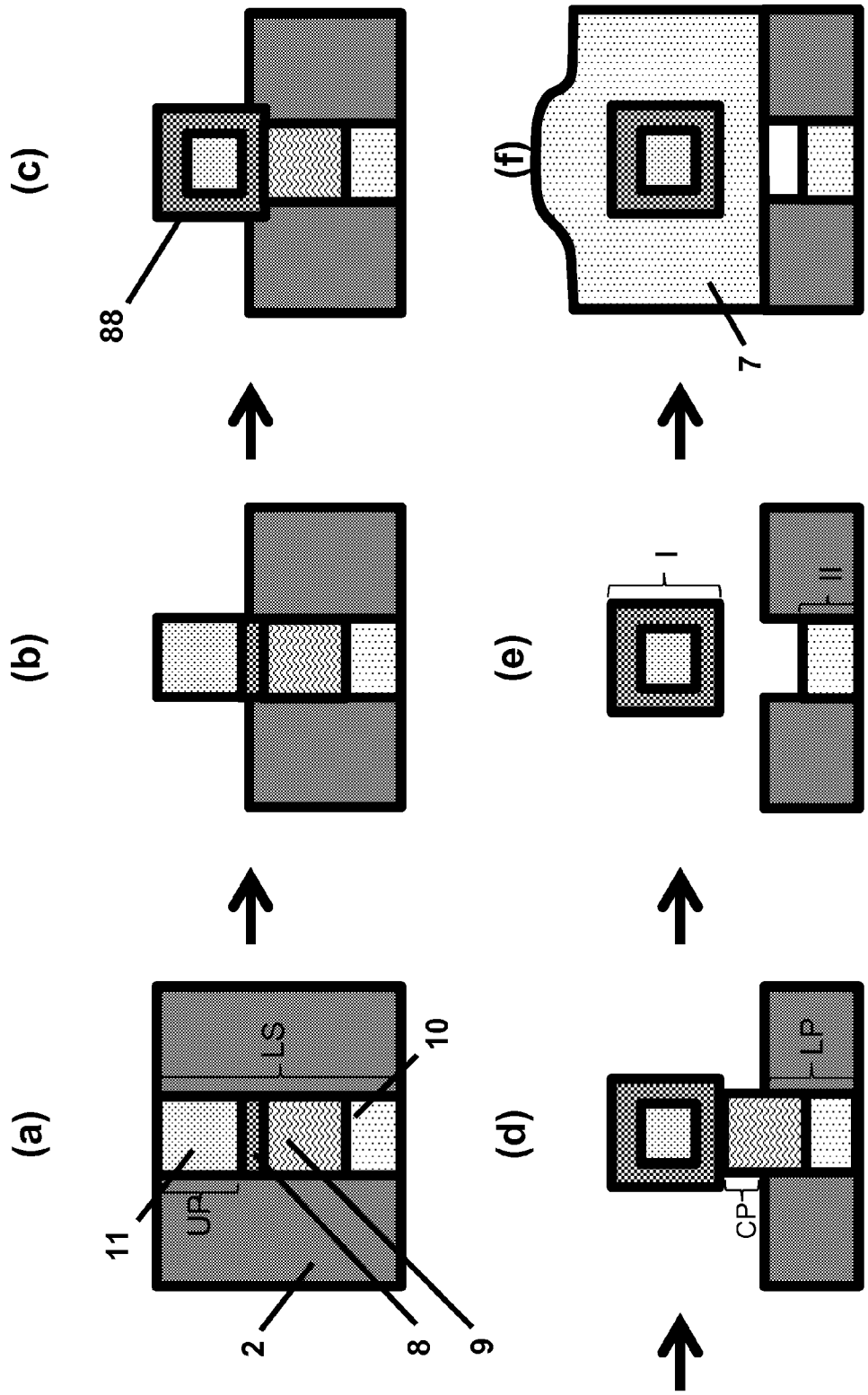
Figure 11:
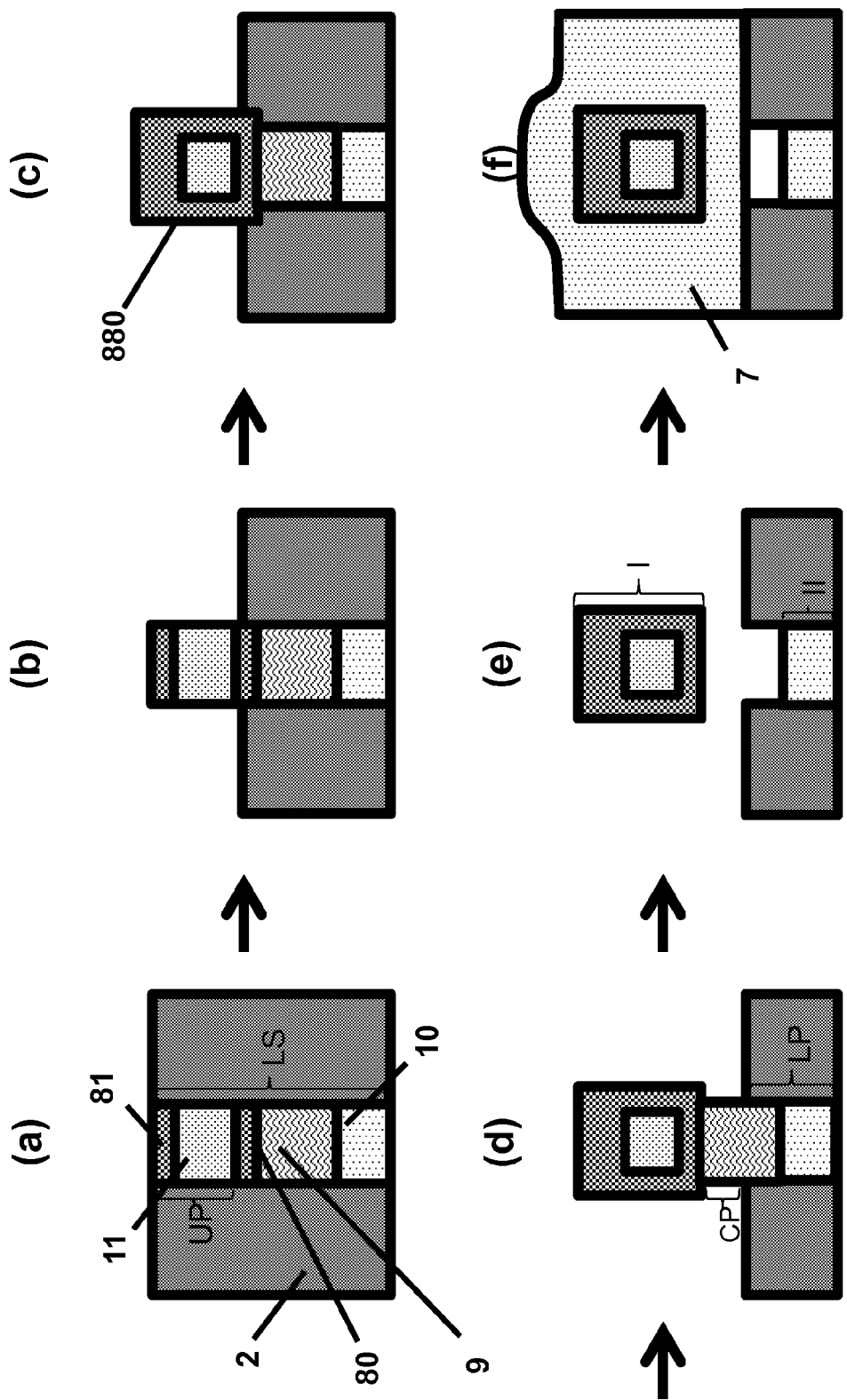

FIG. 7 illustrates a sixth embodiment of the present invention, which is a combination of the embodiment described in relation with FIG. 6 and the embodiment described in relation with FIG. 3. Indeed, the use of the photo-resist layer 3 is replaced by the use of the second etch stop layer 82 having similar functionality (FIG. 7(a)), after which a flow similar to the flow detailed explained for the flow according to FIG. 6 is performed (FIG. 7(b) to (f)).

FIGS. 8, 9, 10 and 11 illustrate further example embodiments of the present invention, which correspond to the embodiments disclosed in relation with FIGS. 2, 3, 4 and 5 respectively, but which differ there from in that the central portion (CP) of the layer stack (LS) comprises a sacrificial layer 9. The sacrificial layer is provided on a lower portion (LP) comprising the virtual buffer layer 10. When removing the central portion of the layer stack, the sacrificial layer 9 is removed, which is adapted and arranged in order to be selectively removable with respect to the virtual buffer layer 10 and etch stop layer 8. These embodiments have the advantage that it is possible to control the shape and extent of the lower part II of the layer stack, without the need for a third etch stop layer.

Figure 12:
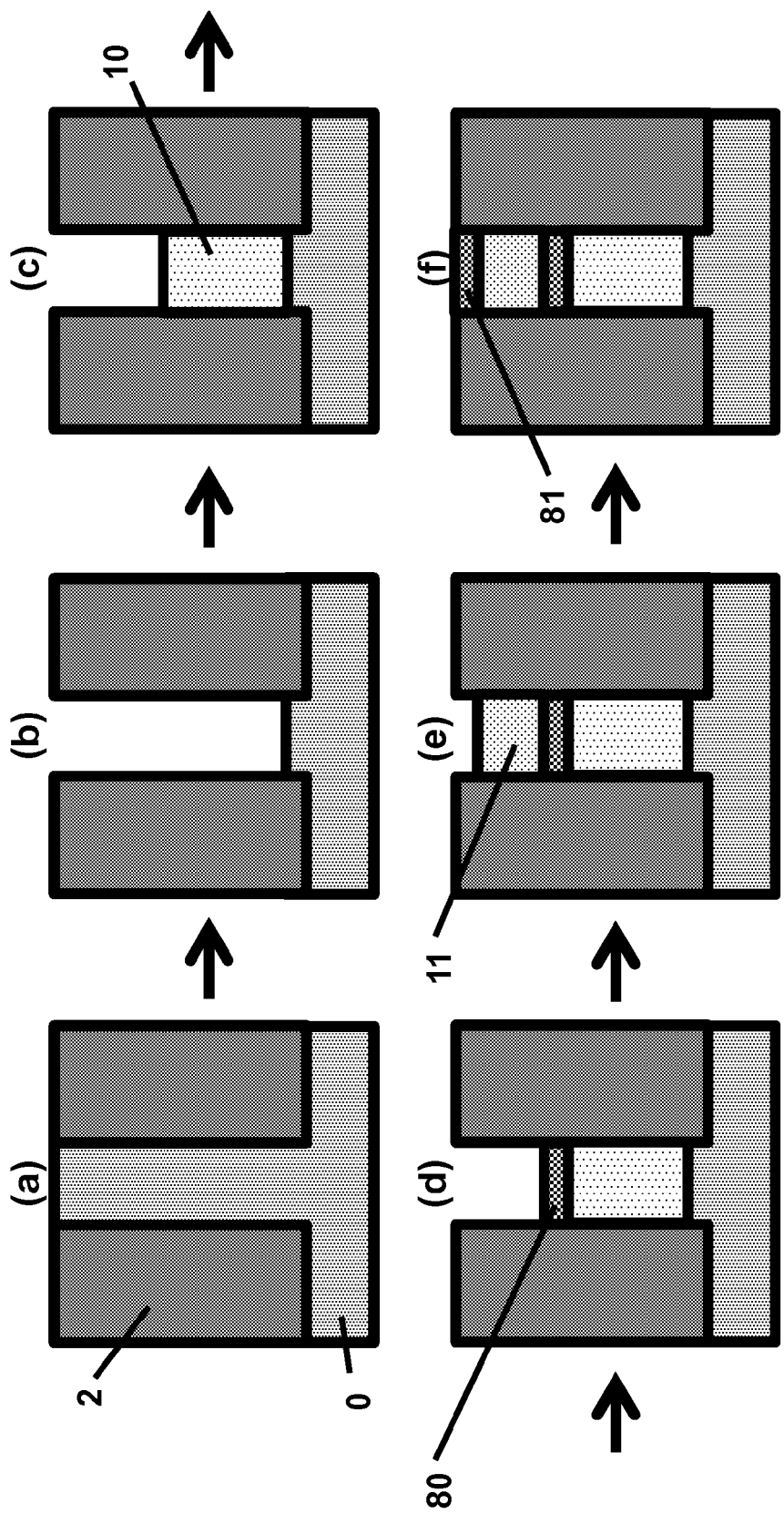
FIGS. 12 to 14 illustrate different methods which can be used in order to provide a layer stack embedded laterally in shallow trench isolation (STI) structures.
Figure 13:
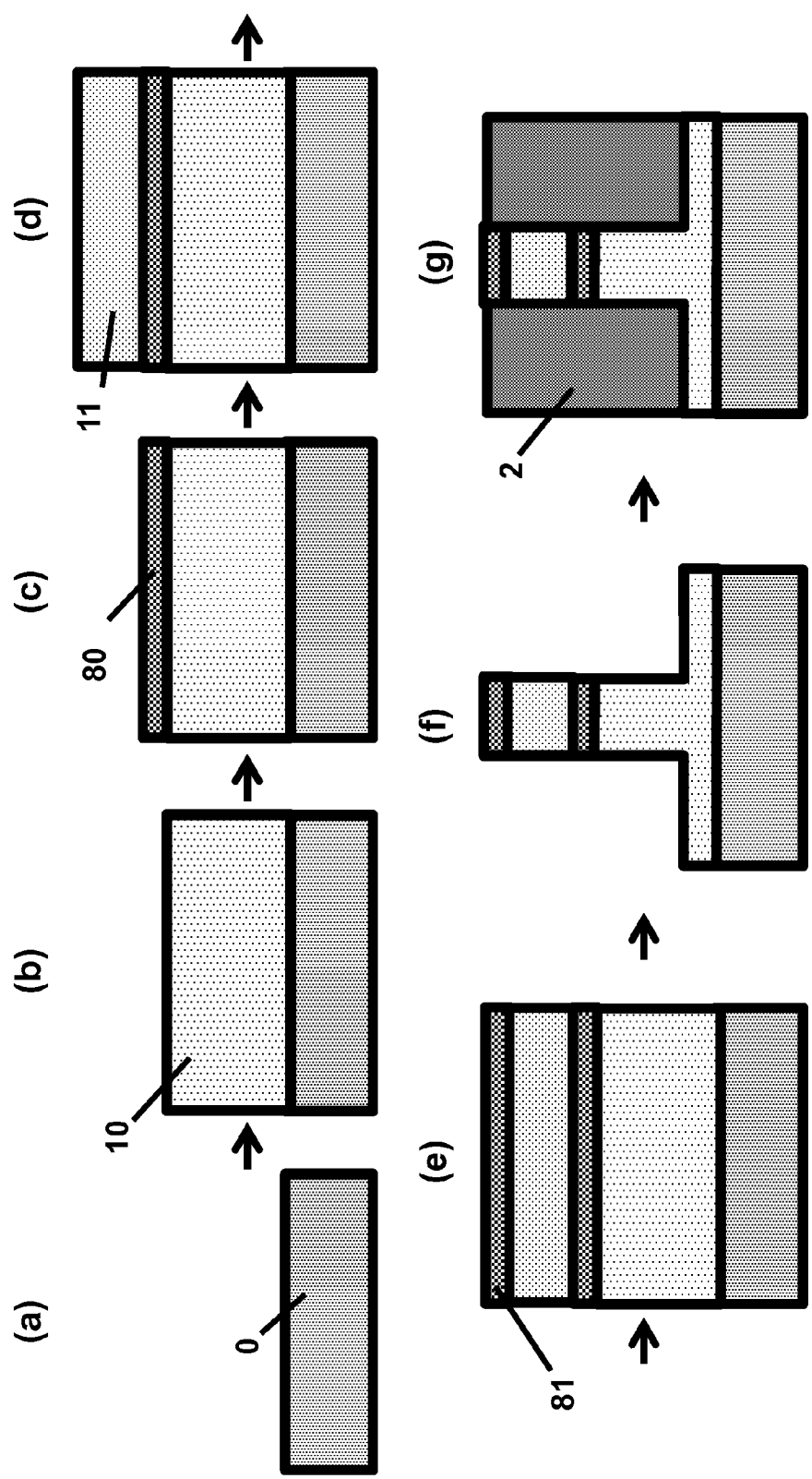
Figure 14:
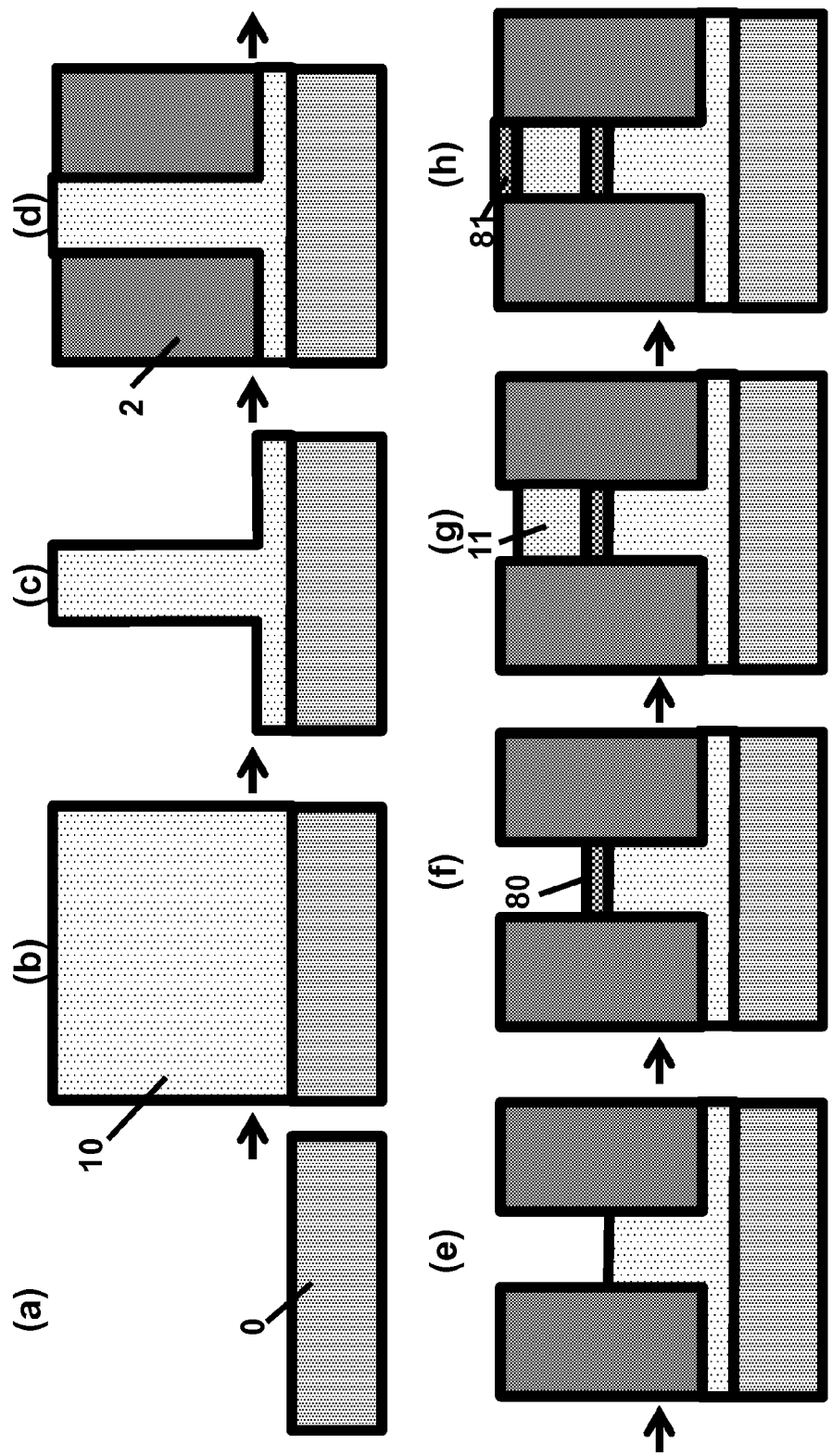

FIGS. 12 to 14 illustrate different methods which can be used in order to provide a layer stack embedded laterally in shallow trench isolation (STI) structures, as they are conceptually known in the prior art as "replacement-fin", "STI-last" and "hybrid" approach.

In FIG. 12, illustrating the "replacement-fin" approach, after the STI module, silicon protrusions extending from a silicon substrate 0 and embedded in the STI structures 2 are produced (FIG. 12(a)). The silicon protrusion is recessed (FIG. 12(b)) and a virtual buffer layer 10 is epitaxially grown/deposited within the created trench (FIG. 12(c)). The etch stop layer 80 is epitaxially grown/deposited in the trench on top of the virtual buffer layer 10 (FIG. 12(d)), and the channel layer 11 (fin) is deposited/grown on top (FIG. 12(e)). A second etch stop layer 81 is then for instance grown on the channel layer 11 (FIG. 12(f)).

In FIG. 13, illustrating the "STI-last" approach, the layer stack (LS) of virtual buffer layer 10, etch stop layer 80, channel layer 11 and for instance second etch stop layer 81 is first grown on a silicon substrate 0 (FIG. 13 (a) to (e)), after which the STI etch process is performed (FIG. 13(f)), patterning the layer stack LS and defining the fin structure. Then, the STI SiO$_2$ is provided in the created recesses, adjacent to the fin structure and embedding the patterned layer stack LS (FIG. 13(g)).

In FIG. 14, illustrating the "hybrid" approach, the virtual buffer layer 10 is provided on a substrate 0 (FIG. 14 (a, b)). The virtual buffer layer is then patterned in order to define protrusion of the virtual buffer layer and thereby the position of the final fin structures (FIG. 14(c)). The protrusions are embedded in the STI structures (FIG. 14(d)), after which a partial recess is performed of the virtual buffer layer protrusions (FIG. 14(e)). The etch stop layer 80 is deposited/grown in the recesses formed, on the recessed virtual buffer layer 10 (FIG. 14(f)). The channel layer 11 is then deposited/grown on top of the etch stop layer 80 within the trenches (FIG. 14(g)), followed for instance by the deposition/growth of a second etch stop layer 81 on top (FIG. 14(h)).

FIG. 15 discloses proposed material systems which are suitable for use in embodiments of the present disclosure which have been disclosed in relation with FIGS. 1 to 7.

For instance, the channel layer 11 can comprise SiGe with a Ge concentration of x %, the virtual buffer layer can comprise SiGe with a Ge concentration of z %, and the etch stop layer can comprise SiGe with a Ge concentration of y %, wherein y is smaller than x and smaller than z.

For instance, the channel layer 11 and the virtual buffer layer can be Ge layers, whereby the etch stop layer can be silicon or silicon germanium having a germanium concentration of 50%.

For instance, the channel layer 11 can be a SiGe layer comprising 75% germanium, the etch stop layer can be silicon, and the virtual buffer layer can be silicon germanium having a germanium concentration of 50%.

Alternative material systems of the III-V type are further disclosed in FIG. 15.

FIG. 16 discloses proposed material systems which are suitable for use in embodiments of the present disclosure which have been disclosed in relation with FIGS. 8 to 11.

For instance, the channel layer 11 can comprise SiGe with a Ge concentration of x %, the virtual buffer layer can comprise SiGe with a Ge concentration of z %, the etch stop layer can comprise SiGe with a Ge concentration of y %, wherein y is smaller than x and smaller than z, and the sacrificial layer can comprise SiGe with a Ge concentration of w %, wherein w is larger than x and larger than z.

For instance, the channel layer 11 can be a Ge layer, the etch stop layer can be a silicon layer, the sacrificial layer can be a Ge layer, and the virtual buffer layer can be a silicon germanium layer having a germanium concentration of 75%.

For instance, the channel layer 11 can be a silicon germanium layer having a germanium concentration of 75%, the etch stop layer can be a silicon layer, the sacrificial layer can be a Ge layer, and the virtual buffer layer can be a silicon germanium layer having a germanium concentration of 50%.

It will be appreciated that the skilled person knows how to etch SiGe selectively to Si, and would know how to proceed when having to selectively etch III-V layers. See for instance "SiGe-On-Insulator (SGOI): Substrate Preparation and MOSFET Fabrication for Emectron Mobility Evaluation", Z. Y. Cheng, M. T. Currie, C. W. Leitz, G. Taraschi, A. Pitera, M. L. Lee, T. A. Langdo, J. L. Hoyt, D. A. Antoniadis, E. A. Fitzgerald, 2001 IEEE International SOI Conference, pp. 13 (2001); and "Etch Rates and Selectivities of Citric Acid/Hydrogen Peroxide on GaAs, Al$_{0.3}$Ga$_{0.7}$As, In$_{0.2}$Ga$_{0.8}$As, In$_{0.53}$Ga$_{0.47}$As, In$_{0.52}$Al$_{0.48}$As, and InP", G. C. DeSalvo, W. F. Tseng, and J. Comas, J. Electrochem. Soc vol. 139(3), pp. 831 (1992).

We claim:

1. A method for forming a transistor structure comprising a fin-shaped channel structure, the method comprising:
    providing a layer stack in a trench defined by adjacent shallow trench isolation (STI) structures;
    recessing the STI structures adjacent to the layer stack to thereby expose an upper portion of the layer stack, the upper portion comprising at least a channel portion;
    providing one or more protection layers on the upper portion of the layer stack;
    after providing the one or more protection layers, further recessing the STI structures selectively to the protection layers and the layer stack, to thereby expose a central portion of the layer stack; and
    selectively removing the central portion of the layer stack, resulting in a freestanding upper part and a lower part of the layer stack being physically separated from each other;
    wherein providing the layer stack comprises providing an etch stop layer at a position directly below the channel portion, such that the freestanding upper part of the layer stack comprises an etch stop layer at its lower surface after selectively removing the central portion.

2. The method of claim 1, wherein the channel portion and the STI structures abut a common planar surface, and wherein the method further comprises providing a patterned hard mask layer on top of the layer stack, before recessing the STI structures, the patterned hard mask layer embodying a protection layer for further recessing the STI structures.

3. The method of claim 1, wherein providing the layer stack comprises providing a second etch stop layer on top of the channel portion, before recessing the STI structures, the second etch stop layer embodying a protection layer for further recessing the STI structures.

4. The method of claim 1, further comprising growing spacer structures directly adjacent to the exposed upper portion of the layer stack, after recessing the STI structures adjacent to the layer stack to thereby expose an upper portion of the layer stack, the spacer structures embodying protection layers for further recessing the STI structures.

5. The method of claim 1, further comprising, directly after recessing the STI structures adjacent to the layer stack to thereby expose an upper portion of the layer stack, epitaxially growing a wrap-around etch stop layer around the exposed upper portion of the layer stack, the wrap-around etch stop layer embodying a protection layer for further recessing the STI structures.

6. The method of claim 1, wherein providing the layer stack comprises providing a third etch stop layer in the layer stack, the third etch stop layer being positioned lower in the stack than the first etch stop layer and being separated thereof by a virtual buffer layer, and wherein the third etch stop layer is arranged and adapted for allowing selectively removing the virtual buffer layer in the central portion of the layer stack, such that after the selective removal the upper layer of the lower part of the layer stack is defined by the third etch stop layer.

7. The method of claim 1, wherein providing the layer stack comprises providing a virtual buffer layer in the central portion of the layer stack, and wherein selectively removing the central portion of the layer stack comprises removing the virtual buffer layer.

8. The method of claim 1, wherein providing the layer stack comprises providing a virtual buffer layer and a sacrificial layer directly on top of the virtual buffer layer, the sacrificial layer embodying the central portion of the layer stack, and wherein selectively removing the central portion of the layer stack comprises removing the sacrificial layer selectively to the virtual buffer layer.

9. The method of claim 1, further comprising removing the etch stop layer after removing the central portion of the layer stack.

10. The method of claim 1, further comprising removing the one or more protection layers, and providing a gate dielectric layer and gate layer stack on the channel layer.

11. The method of claim 1, further comprising providing a gate dielectric layer and gate layer stack on the freestanding upper part of the stack without removing at least one of the protection layers.

12. The method of claim 5, further comprising providing a gate dielectric layer and gate layer stack on the freestanding upper part of the stack.

\* \* \* \* \*